United States Patent
Chamness et al.

(10) Patent No.: US 7,248,939 B1
(45) Date of Patent: Jul. 24, 2007

(54) METHOD AND APPARATUS FOR MULTIVARIATE FAULT DETECTION AND CLASSIFICATION

(75) Inventors: Kevin Andrew Chamness, Austin, TX (US); Daniel Kadosh, Austin, TX (US); Gregory A. Cherry, Kyle, TX (US); Jason Williams, Austin, TX (US)

(73) Assignee: Advanced Micro Devices, Inc., Austin, TX (US)

( * ) Notice: Subject to any disclaimer, the term of this patent is extended or adjusted under 35 U.S.C. 154(b) by 234 days.

(21) Appl. No.: 11/035,276

(22) Filed: Jan. 13, 2005

(51) Int. Cl.
*G06F 19/00* (2006.01)
(52) U.S. Cl. .................. 700/121; 700/109; 438/14
(58) Field of Classification Search .............. 700/96, 700/121, 108, 109; 438/14
See application file for complete search history.

(56) References Cited

U.S. PATENT DOCUMENTS 7,123,980 B2 * 10/2006 Funk et al. ................. 700/121
2005/0015176 A1 * 1/2005 Harada et al. .............. 700/121
2005/0047645 A1 * 3/2005 Funk et al. ................. 382/145
2005/0165731 A1 * 7/2005 Funk ............................. 707/1

OTHER PUBLICATIONS

Cherry et al., "A Generic Object-Oriented System for Wafer-Level Fault Detection and Classification (FDC)," AEC/APC Symposium XV., Sep. 13-18, 2003.
Good et al., "Semiconductor Process Monitoring and Fault Detection Using Recursive Multi-Way PCA Based on a Combined Index" AEC/APC Symposium XIV., Sep. 7-12, 2002.

* cited by examiner

*Primary Examiner*—Leo Picard
*Assistant Examiner*—Steven R. Garland
(74) *Attorney, Agent, or Firm*—Williams, Morgan & Amerson, P.C.

(57) ABSTRACT

The present invention provides a method and apparatus for multivariate fault identification and classification. The method includes accessing data indicative of a plurality of physical parameters associated with a plurality of processed semiconductor wafers and providing at least one summary report including information indicative of at least one univariate representation of the accessed data and at least one multivariate representation of the accessed data.

23 Claims, 9 Drawing Sheets

METHOD AND APPARATUS FOR MULTIVARIATE FAULT DETECTION AND CLASSIFICATION

BACKGROUND OF THE INVENTION

1. Field of the Invention

This invention relates generally to the field of semiconductor device manufacturing and, more particularly, to a method and apparatus for multivariate fault detection and classification.

2. Description of the Related Art

To fabricate a semiconductor device, a wafer is typically processed through numerous processing tools in a predetermined sequence. The processing tools may include photolithography steppers, etch tools, deposition tools, polishing tools, rapid thermal anneal tools, ion implantation tools, and the like. Each processing tool modifies the wafer according to a particular operating recipe and/or operating parameters. For example, a photolithography stepper may be used to form a patterned layer of photoresist having a predetermined thickness above the wafer. Features in the patterned layer of photoresist correspond to a plurality of features, e.g. gate electrode structures, which will ultimately be formed above the surface of the wafer. Metrology tools may be used to collect inline data from the wafer before, during, or after processing by one or more of the tools. For example, the metrology tool may determine a critical dimension of one or more of the gate electrode structures formed above the surface of the wafer.

Despite the quantity of inline data that is collected as wafers are processed down the manufacturing line, the inline data does not typically provide a complete indication of how completed devices will perform when they are tested at the end of the line. Even when individual processes are performing within their specifications, poor device performance can result from cumulative effects from multiple tools and operations. Additionally, some process disturbances may not be detected using the inline data because of inadequacies in the fault detection and classification (FDC) system or due to the existence of disturbances that cannot be measured by existing technology. Accordingly, the completed wafers are typically tested using a post-processing testing unit, such as a wafer electrical test device.

A wafer electrical test device may be used to measure numerous electrical parameters associated with the semiconductor devices formed on the wafer. For example, the wafer electrical test device may measure voltages and/or currents associated with gate electrode structures, or electrical circuits including a plurality of interconnected structures, formed on the surface of the wafer. If one or more of the measured electrical parameters falls outside of a predetermined range or tolerance, a notification may be sent to an engineer monitoring the manufacturing line. For example, a monitoring system may send an e-mail to the engineer monitoring the manufacturing line indicating which of the measured electrical parameters has fallen outside of the predetermined range or tolerance, as well as which wafer included the structure. The engineer may then access data associated with the out-of-range electrical parameter and attempt to diagnose and/or fix faults that may have produced the out-of-range electrical parameter.

The data associated with the measured electrical parameters are typically presented and analyzed as univariate data. For example, a voltage associated with a gate electrode structure formed on each of a plurality of wafers may be presented in a plot of the voltage as a function of wafer number. The plot may also include one or more boundaries or lines indicating an allowable or acceptable range or limit for the voltage. The engineer may then review the voltage plot to determine which wafers include gate electrode structures that produced voltage parameters outside the allowable and/or acceptable range. The engineer may initiate some kind of corrective action, such as scrapping the wafers that include the gate electrode structures that produced the undesirable voltage parameters or altering an operating recipe used to produce the faulty structure.

A typical wafer electrical test device used to monitor performance of semiconductor devices formed on a wafer may collect information associated with about 200 different parameters. In some cases, as many as about 700 parameters may be measured. Accordingly, it may be difficult or impossible for engineers to monitor all of the parameters measured by a wafer electrical test device. For example, engineers may monitor a subset of approximately 40 of the 200 different parameters using a univariate statistical process control (SPC) method. The subset of the parameters may be considered to be the most important parameters or the parameters most likely to indicate a fault and/or warning. Moreover, the indications of allowable and/or acceptable ranges for the parameters used in the SPC method are typically determined by the engineers, which may be a very time-consuming task. Reviewing univariate data may also cause engineers to miss faults and/or warnings associated with correlations between different parameters.

End-of-line monitoring tools typically lack advanced process data monitoring capabilities, such as the ability to provide historical parametric data in a user-friendly format, as well as event logging, real-time graphical display of both current processing parameters and the processing parameters of the entire run, and remote, i.e., local site and worldwide, monitoring. These deficiencies can engender non-optimal control of critical processing parameters, such as throughput, accuracy, stability and repeatability, processing temperatures, mechanical tool parameters, and the like. This variability manifests itself as within-run disparities, run-to-run disparities and tool-to-tool disparities that can propagate into deviations in product quality and performance, whereas an ideal monitoring and diagnostics system for such tools would provide a means of monitoring this variability, as well as providing means for optimizing control of critical parameters.

The present invention is directed to addressing the effects of one or more of the problems set forth above.

SUMMARY OF THE INVENTION

The following presents a simplified summary of the invention in order to provide a basic understanding of some aspects of the invention. This summary is not an exhaustive overview of the invention. It is not intended to identify key or critical elements of the invention or to delineate the scope of the invention. Its sole purpose is to present some concepts in a simplified form as a prelude to the more detailed description that is discussed later.

In one embodiment of the instant invention, an apparatus is for multivariate fault identification and classification. The apparatus includes a memory for storing data indicative of a plurality of electrical parameters associated with a plurality of processed semiconductor wafers and a summary report generator. The summary report generator is configured to access said data and provide at least one summary report including information indicative of at least one univariate representation of the accessed data and at least one multivariate representation of the accessed data.

In another embodiment of the present invention, a method is provided for multivariate fault identification and classification. The method includes accessing data indicative of a plurality of physical parameters associated with a plurality of processed semiconductor wafers and providing at least one summary report including information indicative of at least one univariate representation of the accessed data and at least one multivariate representation of the accessed data.

BRIEF DESCRIPTION OF THE DRAWINGS

The invention may be understood by reference to the following description taken in conjunction with the accompanying drawings, in which like reference numerals identify like elements, and in which.

Figure 1:
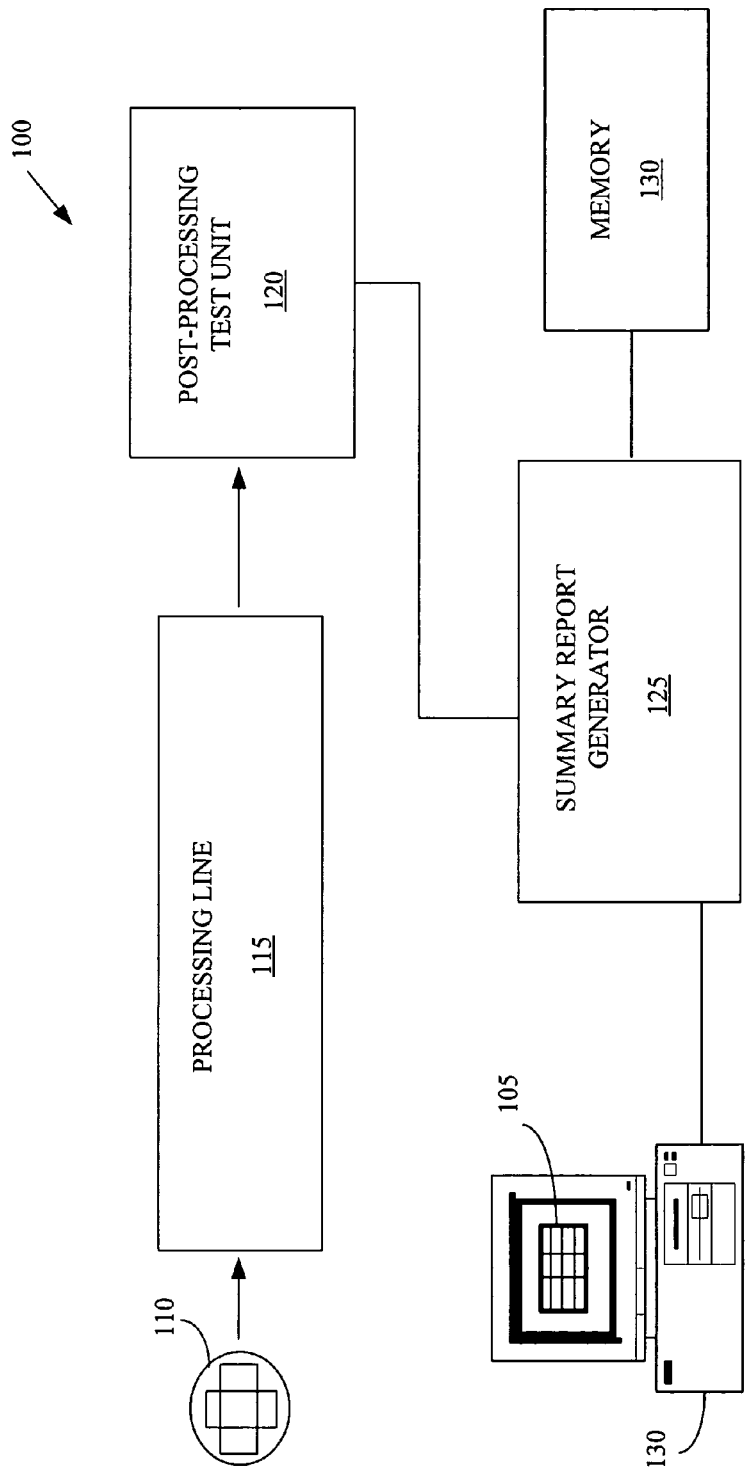
FIG. 1 conceptually illustrates one embodiment of the system, in accordance with the present invention.

While the invention is susceptible to various modifications and alternative forms, specific embodiments thereof have been shown by way of example in the drawings and are herein described in detail. It should be understood, however, that the description herein of specific embodiments is not intended to limit the invention to the particular forms disclosed, but on the contrary, the intention is to cover all modifications, equivalents, and alternatives falling within the spirit and scope of the invention as defined by the appended claims.

DETAILED DESCRIPTION OF SPECIFIC EMBODIMENTS

Illustrative embodiments of the invention are described below. In the interest of clarity, not all features of an actual implementation are described in this specification. It will of course be appreciated that in the development of any such actual embodiment, numerous implementation-specific decisions should be made to achieve the developers' specific goals, such as compliance with system-related and business-related constraints, which will vary from one implementation to another. Moreover, it will be appreciated that such a development effort might be complex and time-consuming, but would nevertheless be a routine undertaking for those of ordinary skill in the art having the benefit of this disclosure.

Portions of the present invention and corresponding detailed description are presented in terms of software, or algorithms and symbolic representations of operations on data bits within a computer memory. These descriptions and representations are the ones by which those of ordinary skill in the art effectively convey the substance of their work to others of ordinary skill in the art. An algorithm, as the term is used here, and as it is used generally, is conceived to be a self-consistent sequence of steps leading to a desired result. The steps are those requiring physical manipulations of physical quantities. Usually, though not necessarily, these quantities take the form of optical, electrical, or magnetic signals capable of being stored, transferred, combined, compared, and otherwise manipulated. It has proven convenient at times, principally for reasons of common usage, to refer to these signals as bits, values, elements, symbols, characters, terms, numbers, or the like.

It should be borne in mind, however, that all of these and similar terms are to be associated with the appropriate physical quantities and are merely convenient labels applied to these quantities. Unless specifically stated otherwise, or as is apparent from the discussion, terms such as "processing" or "computing" or "calculating" or "determining" or "accessing" or "displaying" or the like, refer to the action and processes of a computer system, or similar electronic computing device, that manipulates and transforms data represented as physical, electronic quantities within the computer system's registers and memories into other data similarly represented as physical quantities within the computer system memories or registers or other such information storage, transmission or display devices.

Note also that the software implemented aspects of the invention are typically encoded on some form of program storage medium or implemented over some type of transmission medium. The program storage medium may be magnetic (e.g., a floppy disk or a hard drive) or optical (e.g., a compact disk read only memory, or "CD ROM"), and may be read only or random access. Similarly, the transmission medium may be twisted wire pairs, coaxial cable, optical fiber, or some other suitable transmission medium known to the art. The invention is not limited by these aspects of any given implementation.

The present invention will now be described with reference to the attached figures. Various structures, systems and devices are schematically depicted in the drawings for purposes of explanation only and so as to not obscure the present invention with details that are well known to those skilled in the art. Nevertheless, the attached drawings are included to describe and explain illustrative examples of the present invention. The words and phrases used herein should be understood and interpreted to have a meaning consistent with the understanding of those words and phrases by those skilled in the relevant art. No special definition of a term or phrase, i.e., a definition that is different from the ordinary and customary meaning as understood by those skilled in the art, is intended to be implied by consistent usage of the term or phrase herein. To the extent that a term or phrase is intended to have a special meaning, i.e., a meaning other than that understood by skilled artisans, such a special definition will be expressly set forth in the specification in a definitional manner that directly and unequivocally provides the special definition for the term or phrase.

Referring now to FIG. 1, a system 100 for generating one or more summary reports 105 is shown. In the illustrated embodiment, a wafer 110 is provided to a processing line 115 for processing. The processing line 115 may include a variety of processing tools (not shown) and/or metrology tools (not shown), which may be used to process and/or examine the wafer 110. For example, the processing tools may include photolithography steppers, etch tools, deposition tools, polishing tools, rapid thermal anneal tools, ion implantation tools, and the like. The metrology tools may include scatterometers, ellipsometers, and the like. Techniques for processing the wafer 110 are well known to persons of ordinary skill in the art and therefore will not be discussed in detail herein. Although a single wafer 110 is pictured in FIG. 1, it is to be understood that the wafer 110 is representative of a single wafer as well as a group of wafers, e.g. all or a portion of a wafer lot that may be processed in the processing line 115.

After the wafer 110 has been processed in the processing line 115, the wafer 110 is provided to a post-processing test unit 120. In one embodiment, the post-processing test unit 120 is a wafer electrical test unit. In alternative embodiments, the post-processing test unit 120 may be a stand-alone unit or integral with a portion of the processing line 110. However, persons of ordinary skill in the art should appreciate that any desirable type of post-processing test unit 120 may be used in the system 200. As will be discussed in detail below, the post-processing test unit 120 performs measurements of physical parameters associated with the wafer 110 and/or structures that are formed on the wafer 110. As used herein, the term "physical parameter" will be understood to refer to parameters associated with the physical dimensions and/or characteristics of structures formed on the wafer 110, as well as electrical properties of structures formed on the wafer 110. For example, a wafer electrical test unit may measure voltages and/or currents between various nodes and circuits that are formed on the wafer 110. In one embodiment, the physical parameters may be grouped in a hierarchical grouping that is determined based upon one or more structures associated with the physical parameter. Composite physical parameters may then be formed using the physical parameters associated with each group, as will be discussed in detail below.

The system 100 also includes a summary report generator 125 that can access information indicative of the physical parameters measured by the post-processing test unit 120. The information indicative of the physical parameters may include information associated with the wafer 110, as well as any previously processed wafers. In one embodiment, the summary report generator 125 is communicatively coupled to the post-processing test unit 120 and therefore may access the information indicative of the measurements of the physical parameters directly from the post-processing test unit 120. However, the present invention is not so limited. For example, in one alternative embodiment, the information indicative of the measurements of the physical parameters may be stored in a memory 130. The summary report generator 125 may then access the information indicative of the measurements of the physical parameters from the memory 130. In one embodiment, the summary report generator 125 may determine one or more groups of the physical parameters and/or one or more composite physical parameters.

The summary report generator 125 can also generate the summary report 105 using the information indicative of the measurements of the physical parameters associated with one or more wafers 110. In one embodiment, the summary report generator 125 determines how many wafers 110 have values of each physical parameter outside of one or more univariate limits associated with the corresponding physical parameter. The summary report generator 125 may then include this number in the summary report 105, as will be discussed in detail below. The summary report generator 125 may also determine how many wafers 110 have values of the composite physical parameters outside of one or more multivariate limits formed based on a model, such as a recursive principal component analysis (RPCA) model. The summary report generator 125 may also include this number in the summary report 105.

In one embodiment, the summary report 105 may be provided to an engineer by e-mailing the summary report 105 to a computer 130. The summary report 105 may then be provided as a graphical user interface that may be accessed by the engineer. As will be discussed in detail below, the summary report 105 may then be used to access data associated with the groups, e.g. by utilizing the graphical user interface.

Figure 2:
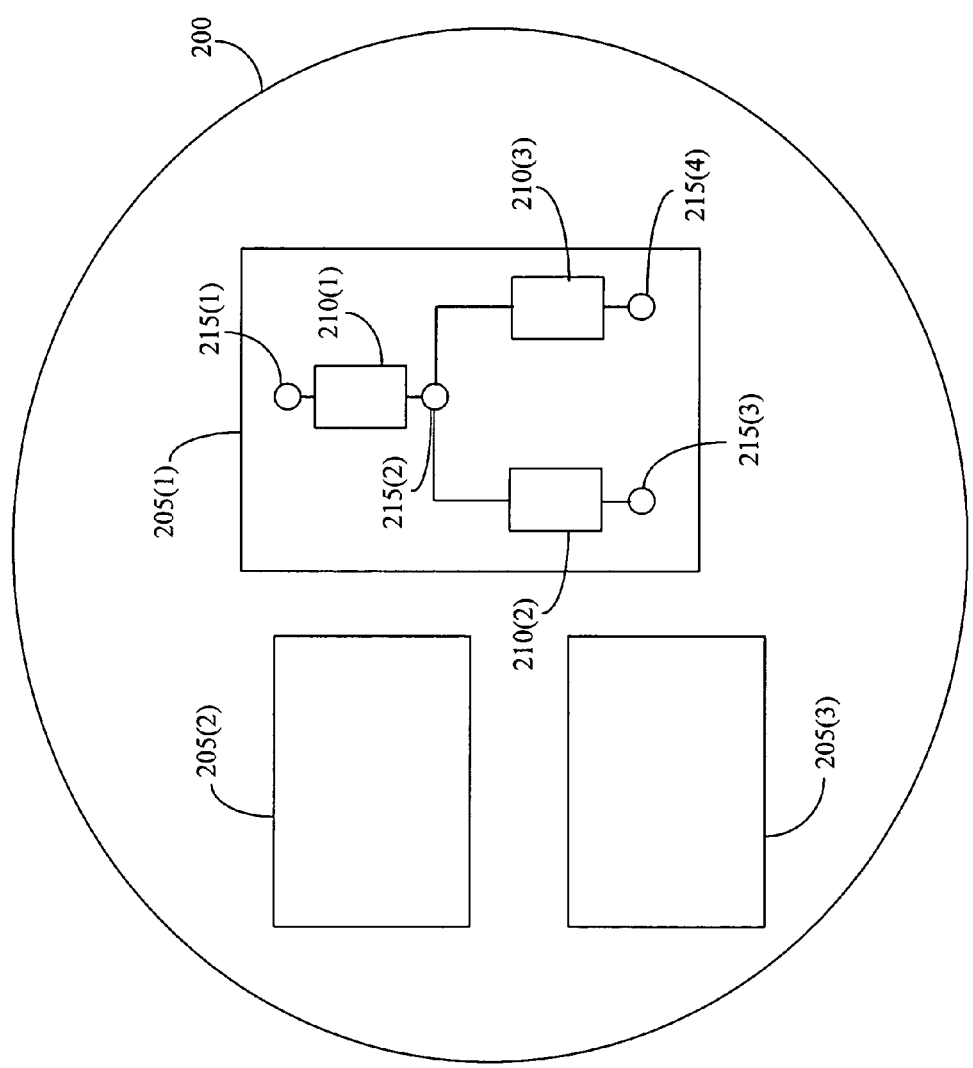
FIG. 2 conceptually illustrates one exemplary embodiment of a wafer, such as a wafer that has been processed by the system shown in FIG. 1, in accordance with the present invention.

FIG. 2 conceptually illustrates one exemplary embodiment of a wafer 200. In the illustrated embodiment, the wafer 200 has been processed, e.g. by the processing line 115 shown in FIG. 1. A plurality of devices 205(1-3), which may sometimes be referred to as layers, has been formed on the wafer 200. The devices 205(1-3) may be any desirable semiconductor device including, but not limited to, transistors, diodes, and resistors, as well as circuits including various combinations of semiconductor devices coupled by lines, vias, and the like. Although only three devices 205(1-3) are shown in FIG. 2, persons of ordinary skill in the art should appreciate that any desirable number of devices 205(1-3) may be formed on a wafer. Moreover, persons of ordinary skill in the art should appreciate that the devices 205(1-3) are not be drawn to scale in FIG. 2.

The device 205(1) includes a plurality of elements 210(1-3). In accordance with common usage in the art, the elements 210(1-3) may also be referred to as scrap codes. In various alternative embodiments, the elements 210(1-3) may include transistors, diodes, and resistors, as well as circuits including various combinations of semiconductor devices coupled by conductive lines, vias, and the like. The elements 210(1-3) are electrically coupled to one or more nodes 215(1-4), e.g. by conductive lines and/or vias. Although not depicted in FIG. 2, persons of ordinary skill in the art should appreciate that the devices 205(2-3) may also include one or more elements.

Physical parameters associated with the devices 205(1-3) and/or the elements 210(1-3) may be measured. For example, the physical parameters associated with the devices 205(1-3) and/or the elements 210(1-3) may be measured using a post-processing test unit such as the post-processing test unit 120 shown in FIG. 1. In one embodiment, the physical parameters are electrical parameters that may be measured using a wafer electrical test unit. For example, the wafer electrical test unit may measure a current and/or voltage across the elements 210(1), i.e. a voltage and/or current between the node 215(1) and the node 215(2). Electrical parameters associated with more than one element 210 (1-3) may also be measured. For example, the wafer electrical test unit may measure a current and/or voltage across the elements 210(1-2), i.e. a voltage and/or current between the node 215(1) and the node 215(3).

One or more univariate limits may be associated with one or more of the physical parameters. For example, upper and lower warning and/or fault limits on the values of one or more of the physical parameters may be set. As will be discussed in detail below, a warning and/or fault may be detected when the value of the physical parameter associated with one or more of the devices 205(1-3) and/or the elements 210(1-3) on the wafer 200 exceeds one or more of the univariate limits. In one embodiment, the univariate limits may include specification limits, statistical process control limits, and the like. These limits may be static limits, which may be periodically changed, e.g. by an engineer. Alternatively, the univariate limits may be dynamic limits formed based on a model. For example, the univariate limits may be dynamic limits formed using a recursive principal component analysis model, as well as one or more current and/or previous values of the physical parameters. Principal component analysis (PCA) is a known multivariate technique that models the correlation structure in the data by reducing the dimensionality of the data using eigenvectors of a correlation matrix. In recursive principal component analysis, the correlation matrix is calculated recursively. In the interest of clarity, details of this known technique will not be described herein. Persons of ordinary skill in the art should also appreciate that the present invention is not limited to recursive principal component analysis models. In alternative embodiments, any desirable model may be used.

Composite physical parameters may be formed using the physical parameters associated with the devices 205(1-3) and/or the elements 210(1-3). In one embodiment, the composite physical parameters may be formed using a model, such as a recursive principal component analysis model. For example, the recursive principal component analysis model may be used to derive a composite physical parameter referred to as the combined index, which provides a measure of deviation both within the principal component analysis model, as well outside of the model. In one embodiment, the combined index is derived using physical parameters associated with the overall performance of the devices 205(1-3) and/or the elements 210(1-3) formed on the wafer 200.

One or more multivariate limits may also be determined using the model. For example, the recursive principal component analysis model may be used to derive one or more limits on the combined index. In one embodiment, a warning limit may be set when the value of the combined index exceeds a statistically determined 99% threshold, and a fault limit may be set when the value of the combined index exceeds a statistically determined 99.9% threshold. Alternatively, the combined index may be normalized about a statistically determined threshold such that the warning limit corresponds to a normalized combined index value of 1.0 and the fault limit corresponds to a normalized combined index value of 2.0. As will be discussed in detail below, a warning and/or fault may be detected when the value of the composite physical parameter associated with one or more of the devices 205(1-3) and/or the elements 210(1-3) on the wafer 200 exceeds the warning limit and/or the fault limit. In one embodiment, the physical parameters, composite physical parameters, univariate limits, and/or multivariate limits described above may be organized into groups, including a hierarchical grouping.

Figure 3:
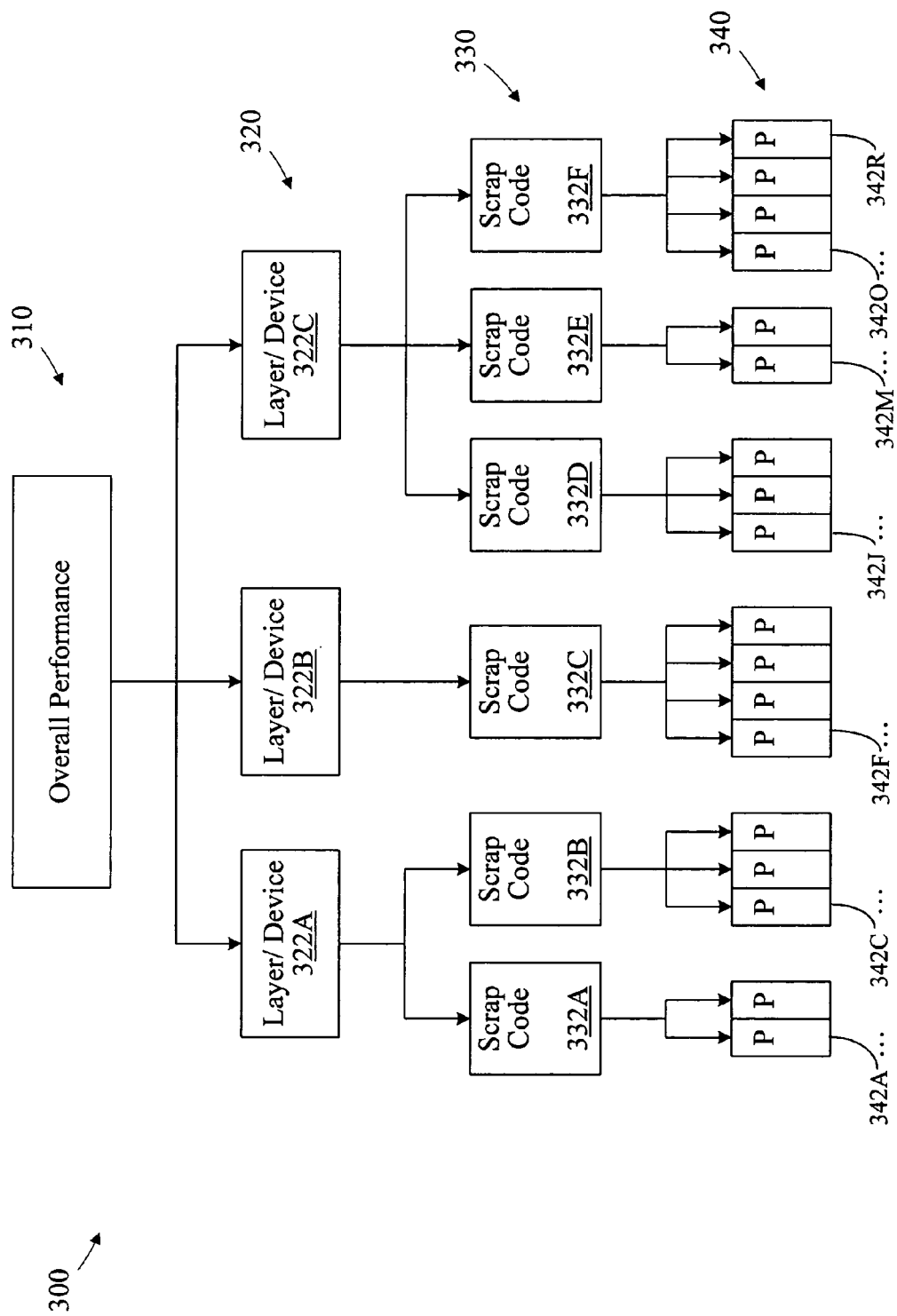
FIG. 3 conceptually illustrates one exemplary embodiment of a hierarchical grouping of the physical parameters associated with structures on a wafer, in accordance with the present invention.

FIG. 3 conceptually illustrates one exemplary embodiment of a hierarchical grouping 300 of the physical parameters associated with structures on a wafer, such as the devices 205(1-3) and/or the elements 210(1-3) formed on the wafer 200 shown in FIG. 2. The hierarchical grouping 300 includes an overall performance level 310 that groups together the physical parameters associated with the overall performance of structures formed on the wafer, as well as composite physical parameters indicative of the overall performance of structures formed on the wafer. For example, if the wafer implements a central processing unit, the overall performance level 310 may include a composite physical parameter indicative of a clock speed of the central processing unit, which may be formed using the measured physical parameters such as voltage is and/or currents of individual components of the central processing unit. Persons of ordinary skill in the art should appreciate that the hierarchical grouping 300 may not always be formed based on structures formed on the wafer. In alternative embodiments, any desirable criteria for establishing the hierarchical grouping 300 may be used.

In the illustrated embodiment, the hierarchical grouping 300 includes a layer and/or device level 320 below the overall performance level 310. The device level 320 includes one or more device groups 322A-C. Each device group 322A-C groups together the physical parameters associated with the selected devices formed on the wafer, as well as composite physical parameters that may be associated with the selected devices. In the illustrated embodiment, the device groups 322A-C include parameters and/or composite parameters associated with the devices 205(1-3) shown in FIG. 2. For example, if the device 205(1) is a diode, the device group 322A may include physical parameters and/or composite physical parameters indicative of a threshold voltage of the diode. Each device group 322A-C in the device level 320 may be associated with a scrap code level 330 including one or more scrap code groups 332A-F. Each scrap code group 332A-F groups together the physical parameters associated with the selected scrap codes formed on the wafer, as well as composite physical parameters that may be associated with the selected scrap codes. The grouped parameters at the levels 320, 330 may be referred to as "block variable" or "grouping variables." Persons of ordinary skill in the art should also appreciate that there may be more or fewer layers 320, 300 in other embodiments of the present invention.

A parameter level 340 includes the individual physical parameters (P) 342A-R that may be measured, e.g. by the post-processing test unit 120 shown in FIG. 1. For example, the individual physical parameters 342A-R may include voltages and/or currents. Each of the individual physical parameters 342A-R is associated with a corresponding scrap code 232A-F. Persons of ordinary skill in the art should appreciate that the number of physical parameters 342A-R, the number of scrap code groups 332A-F, the number of device groups 322A-C, as well as the number of levels 310, 320, 330, 340 shown in FIG. 3 are intended to be illustrative and not to limit the present invention. In alternative embodiments, any desirable number of layers may be chosen, and each layer may be grouped into any desirable number of groups.

The physical parameters and/or composite physical parameters in the overall performance layer 310 may be referred to as an overall group. The physical parameters and/or composite physical parameters in the other layers 320, 330, 340 may be referred to as tier groups. In one embodiment, the hierarchical group 300 including an overall group and one or more tier groups may be used to form a summary report.

Figure 4:
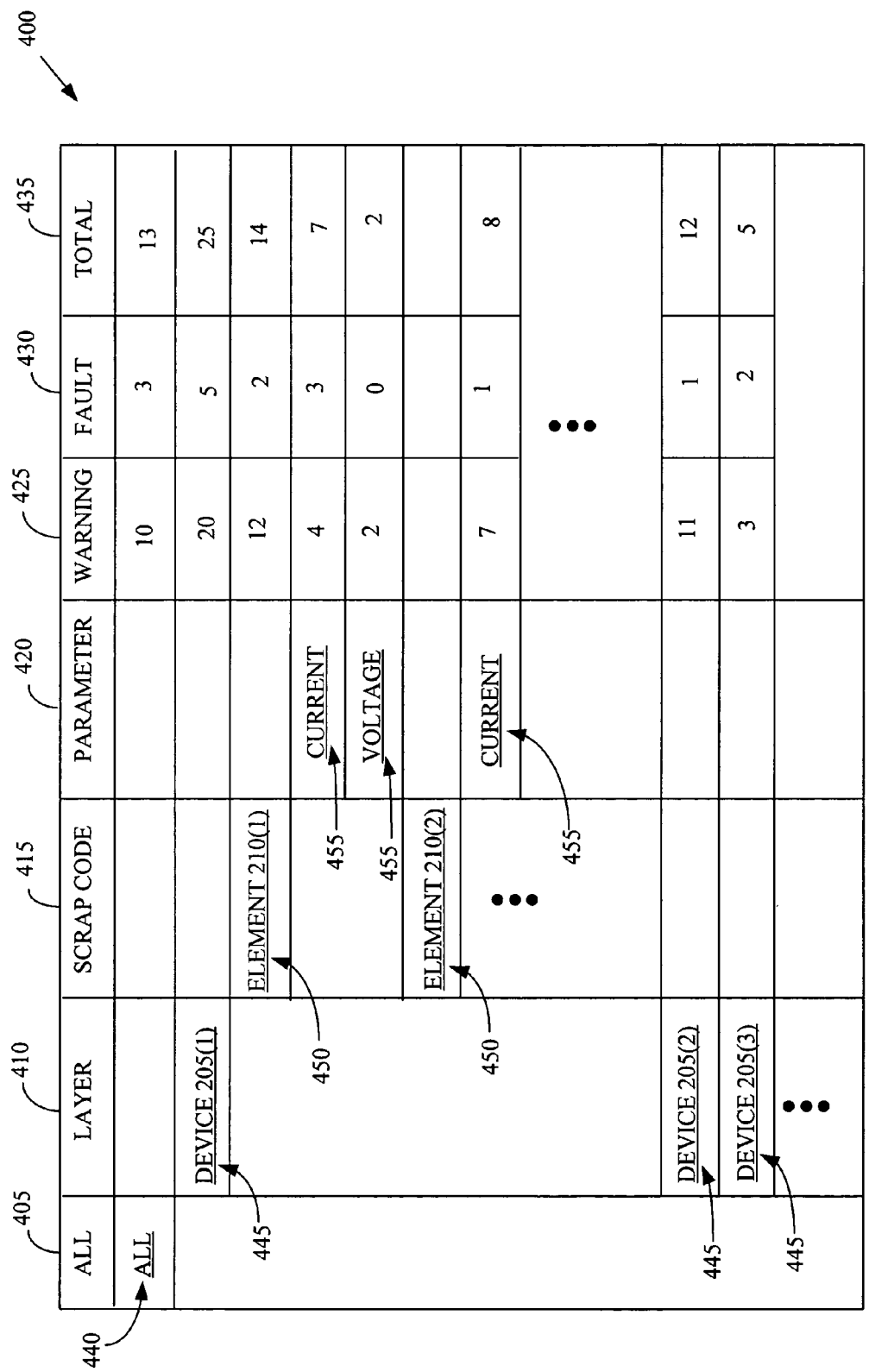
FIG. 4 conceptually illustrates one exemplary embodiment of a summary report, in accordance with the present invention.

FIG. 4 conceptually illustrates one exemplary embodiment of a summary report 400. The summary report 400 includes information indicative of the number of warnings and/or faults associated with wafers processed in a processing line, such as the processing line 115 shown in FIG. 1. In one embodiment, the summary report 400 may be produced at predetermined intervals and contains information indicative of the performance of wafers processed by the processing line during the predetermined intervals. For example, the summary report 400 may be periodically generated by a summary report generator, such as the summary report generator 125 shown in FIG. 1.

In the illustrated embodiment, the summary report 400 includes columns associated with the overall performance (ALL) 405, each layer and/or device 410, the scrap codes 415, the physical parameters and/or composite physical parameters 420, warnings 425, faults 430, and a total number of warnings and/or faults 435. The summary report 400 is organized to correspond to a hierarchical grouping, such as the hierarchical grouping shown in FIG. 3. Accordingly, the overall performance column 405 shown in FIG. 4 includes an entry 440 as indicated by the word ALL, the layer column 410 includes entries 445 corresponding to the devices 210(1-3) shown in FIG. 2, the scrap code of column 415 includes entries 450 corresponding to the elements 215(1-2), and the parameter column 420 includes entries 455 corresponding to currents and/or voltages associated with these elements 215(1-2). However, persons of ordinary skill in the art should appreciate that the summary report 400 is intended to be illustrative and not to limit the present invention. In alternative embodiments, any desirable format for the summary report 400 may be chosen.

The rows of the summary report 400 corresponding to entries 440, 445, 450, 455 include information indicative of the number of warnings and faults associated with the overall performance, the devices, the elements, and the parameters, respectively. As discussed above, the number of warnings and/or faults associated with the overall performance, devices, the elements, the parameters, and the like may be determined using univariate and/or multivariate limits. For example, the number of overall warnings and/or faults may be determined using one or more multivariate limits on composite parameters associated with the overall performance. The multivariate limits and/or the composite parameters may be determined using a recursive principal component analysis model. In one embodiment, the rows are organized according to the number of warnings and/or faults. For example, the entry 445 corresponding to the device 205(1) is presented first because it has the largest total number of associated faults and warnings. In the illustrated embodiment, entries in the total column 435 are calculated as a logical "OR" of all the wafers having a warning and/or fault. Thus, if more than one criterion is used to detect warnings and/or faults, the value in the total column 435 may not be the sum of values in other columns.

In one embodiment, the summary report 400 may be presented as a graphical user interface. For example, the summary report 400 may be e-mailed to a computer, such as the computer 130 shown in FIG. 1, where it may be displayed as a graphical user interface. Accordingly, the entries 440, 445, 450, 455 may be configured to allow the engineer to access additional information indicative of the physical parameters and/or composite physical parameters associated with the entries 440, 445, 450, 455. For example, the engineer may mouse over one of the entries 440, 445, 450, 455 shown in the graphical user interface and click on the entry 440, 445, 450, 455 to access additional information. For example, the additional information may include one or more plots of the physical parameters and/or composite physical parameters associated with the entries 440, 445, 450, 455. The accessed plots may also include information indicative of one or more univariate and/or multivariate limits associated with the entries 440, 445, 450, 455. Accessing additional information associated with different levels of information organized in a hierarchical group in this manner is sometimes referred to as "drilling down."

Figure 5:
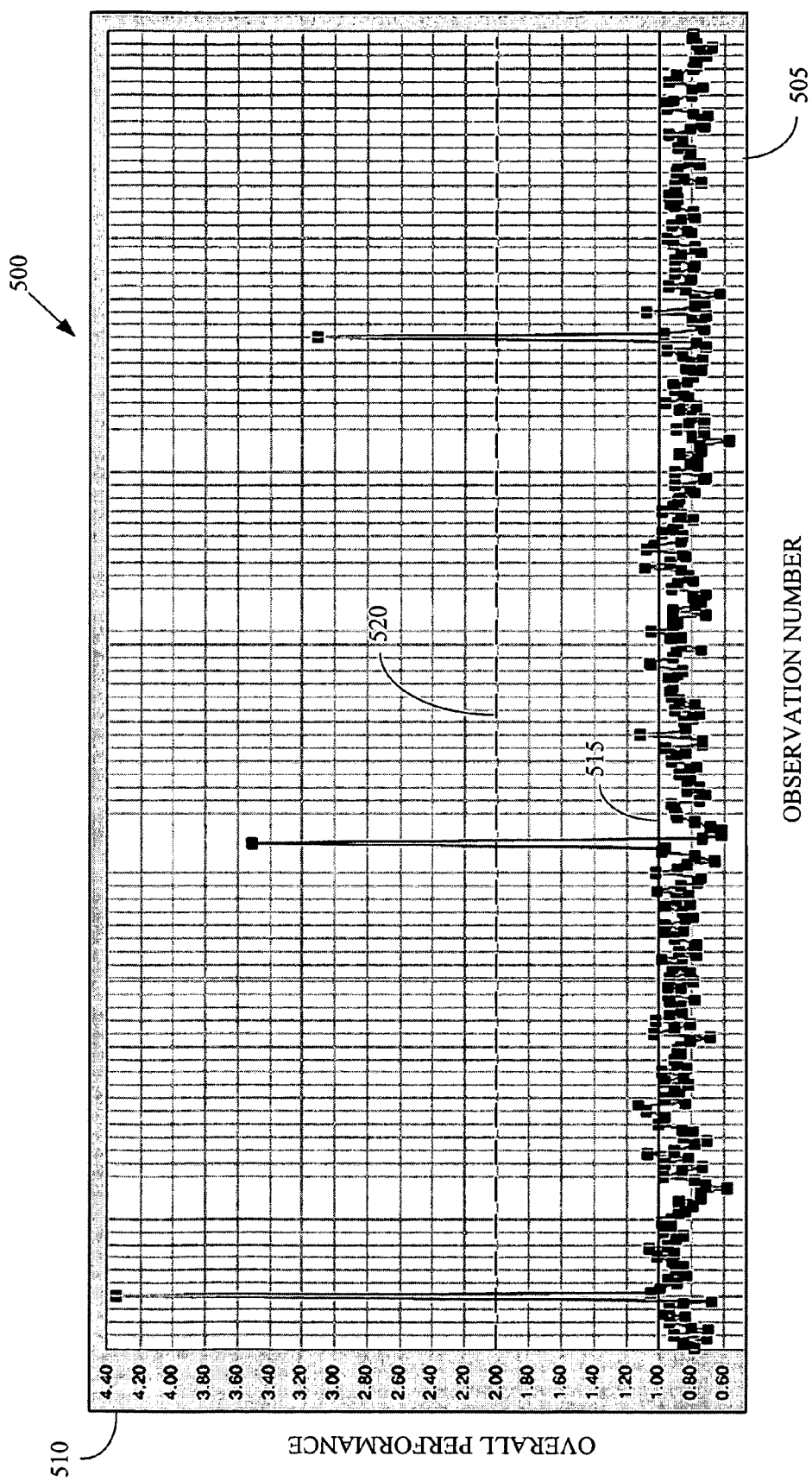
FIG. 5 shows a plot of a plurality of composite physical parameters associated with an overall performance level of a corresponding plurality of wafers, in accordance with the present invention.

FIG. 5 shows a plot 500 of a plurality of composite physical parameters associated with an overall performance level of a corresponding plurality of wafers. For example, the plot 500 may be accessed via the entry 440 in the summary report 400 shown in FIG. 4. The horizontal axis 505 indicates wafers number and the vertical axis 510 indicates value of the composite physical parameter. In the illustrated embodiment, the composite physical parameter is calculated using a recursive principal component analysis model. The plot 500 includes the multivariate warning limit 515 and a multivariate fault limit 520, which may be calculated using the recursive principal component analysis model. The plot 500 indicates that approximately three wafers have values of the composite physical parameter that exceed the multivariate fault limit 520, and numerous wafers that have values of the composite physical parameter that exceed the multivariate warning limit 515.

Figure 6:
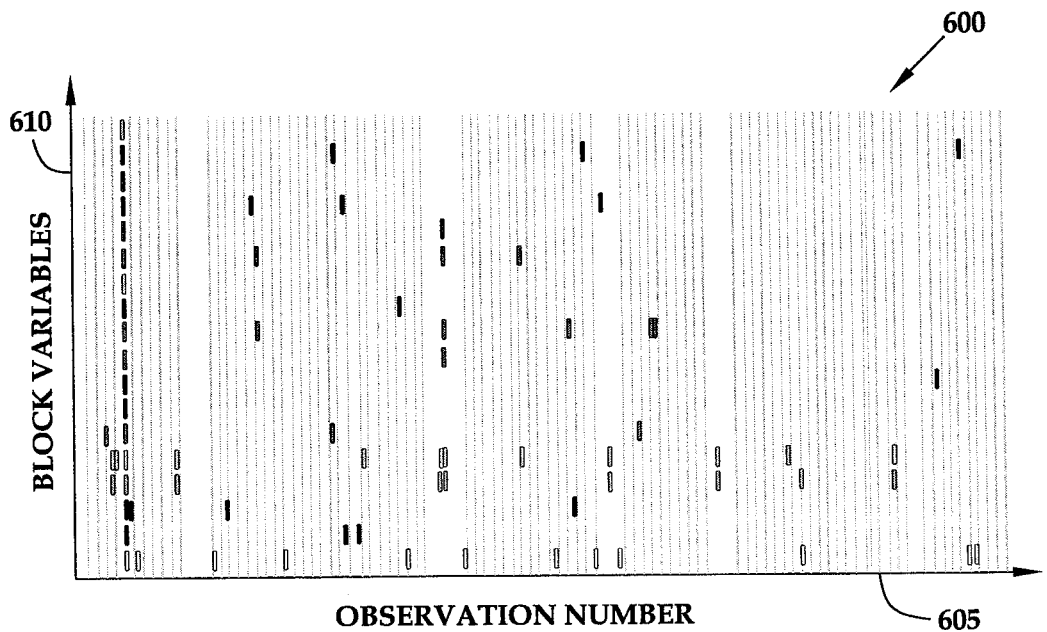
FIG. 6 shows a plot of a plurality of physical parameters and/or composite physical parameters associated with a device group at a device level of a corresponding plurality of wafers, in accordance with the present invention.

FIG. 6 shows a plot 600 of a plurality of physical parameters and/or composite physical parameters associated with a device group at a device level of a corresponding plurality of wafers. For example, the plot 600 may be a bitmap plot that is accessed via the one of the entries 445 in the summary report 400 shown in FIG. 4. The horizontal axis 605 indicates a wafer number and the vertical axis 610 indicates value of a physical parameter and/or composite physical parameter associated with device level groups. In the illustrated embodiment, the composite physical parameter is calculated using a recursive principal component analysis model. Univariate and/or multivariate warning and fault limits associated with the physical parameters and/or composite physical parameters have also been calculated using the recursive principal component analysis model. The plot 600 shows a plurality of dashes for each physical parameter and/or composite physical parameter determined for each wafer. Relatively light dashes indicate that the physical parameter and/or composite physical parameter exceed a warning limit and relatively dark dashes indicate that the physical parameter and/or composite physical parameter exceed a fault limit.

Figure 7:
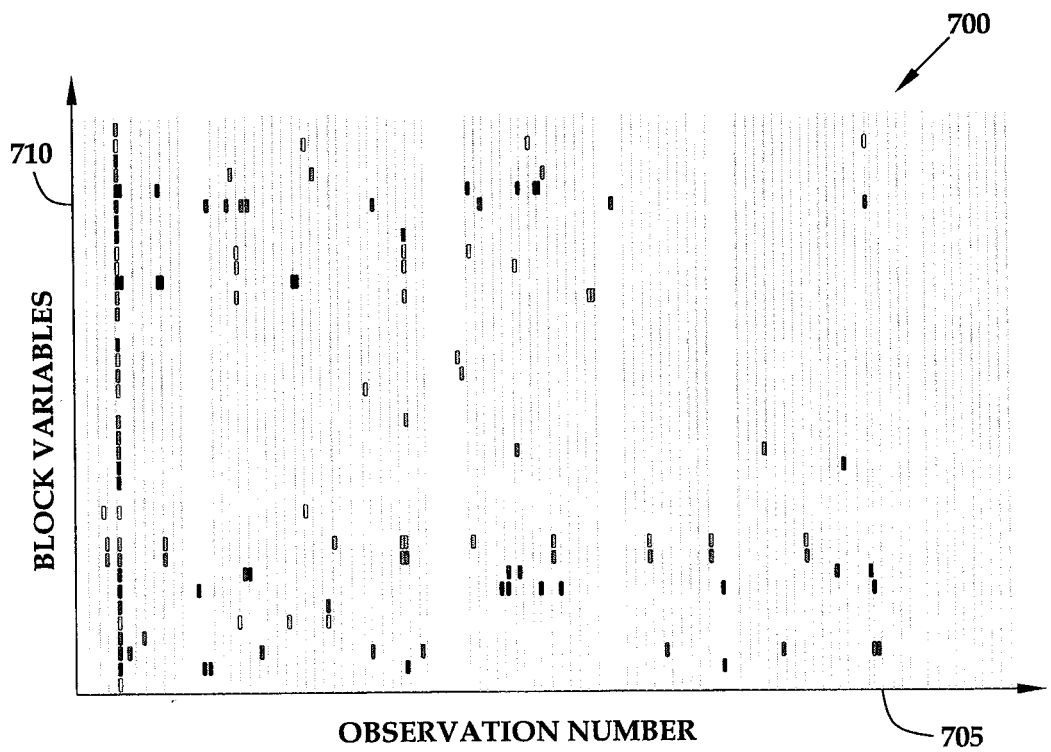
FIG. 7 shows a plot of a plurality of physical parameters and/or composite physical parameters associated with a scrap code group at a scrap code level of a corresponding plurality of wafers, in accordance with the present invention.

FIG. 7 shows a plot 700 of a plurality of physical parameters and/or composite physical parameters associated with a scrap code group at a scrap code level of a corresponding plurality of wafers. For example, the plot 700 may be a bitmap plot that is accessed via the one of the entries 450 in the summary report 400 shown in FIG. 4. The horizontal axis 705 indicates a wafer number and the vertical axis 710 indicates value of a physical parameter and/or composite physical parameter associated with scrap code level groups. In the illustrated embodiment, the composite physical parameter is calculated using a recursive principal component analysis model. Univariate and/or multivariate warning and fault limits associated with the physical parameters and/or composite physical parameters have also been calculated using the recursive principal component analysis model. The plot 700 shows a plurality of dashes for each physical parameter and/or composite physical parameter determined for each wafer. In the illustrated embodiment, the dashes indicate that the physical parameter and/or composite physical parameter exceed a warning limit. In alternative embodiments, the dashes may be used to indicate that the physical parameter and/or composite physical parameter exceed a fault limit or any other desirable threshold.

Figure 8:
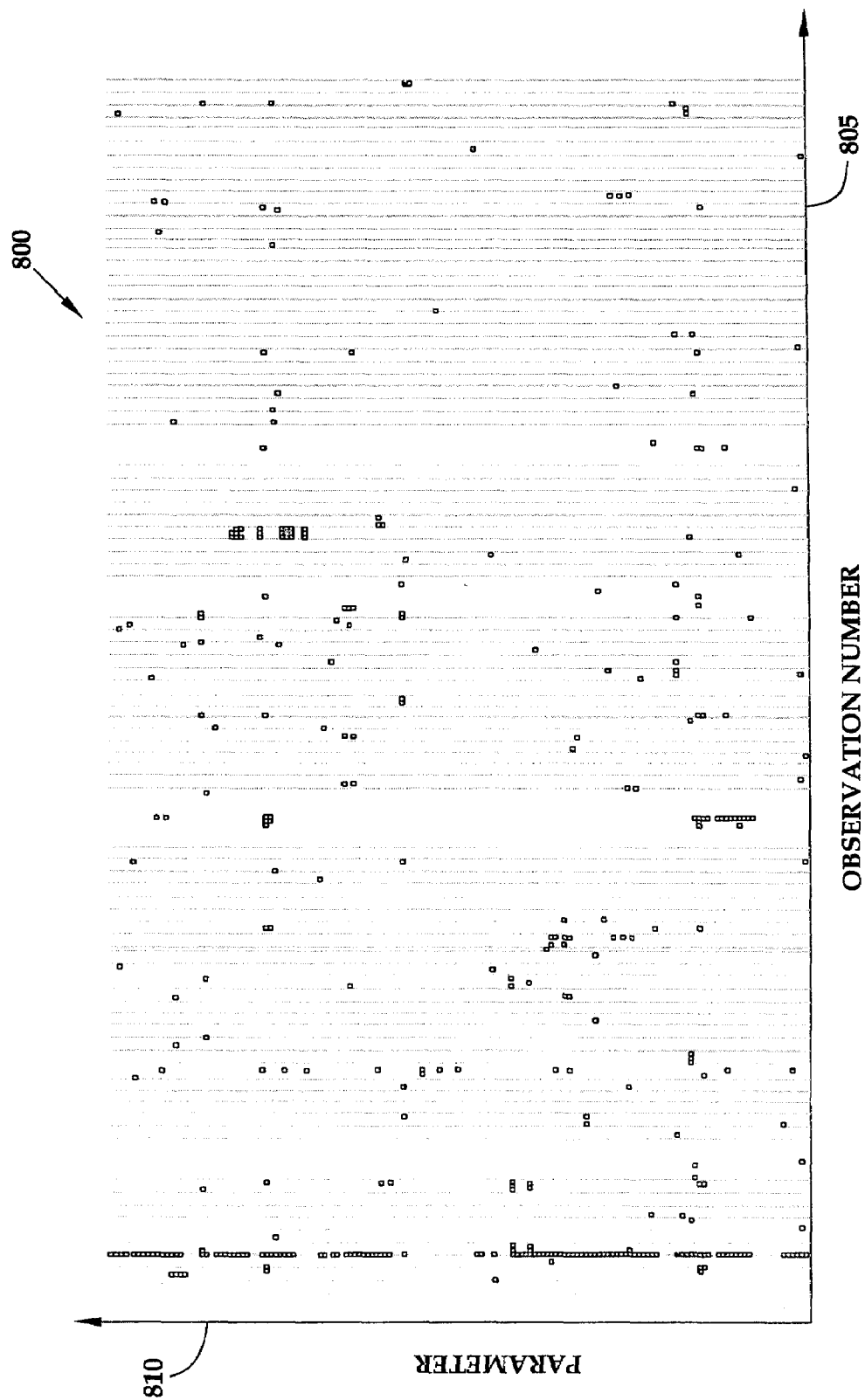
FIG. 8 shows a plot of a plurality of physical parameters and/or composite physical parameters at a parameter level of a corresponding plurality of wafers, in accordance with the present invention.

FIG. 8 shows a plot 800 of a plurality of physical parameters and/or composite physical parameters at a parameter level of a corresponding plurality of wafers. For example, the plot 800 may be a bitmap plot that is accessed via the one of the entries 455 in the summary report 400 shown in FIG. 4. The horizontal axis 805 indicates a wafer number and the vertical axis 810 indicates value of a physical parameter and/or composite physical parameter associated with the parameters. In the illustrated embodiment, the composite physical parameter is calculated using a recursive principal component analysis model. Univariate and/or multivariate warning and fault limits associated with the physical parameters and/or composite physical parameters have also been calculated using the recursive principal component analysis model. The plot 800 shows a plurality of dashes for each physical parameter and/or composite physical parameter determined for each wafer. In the illustrated embodiment, the dashes indicate that the physical parameter and/or composite physical parameter exceed a warning limit. In alternative embodiments, the dashes may be used to indicate that the physical parameter and/or composite physical parameter exceed a fault limit or any other desirable threshold.

Figure 9:
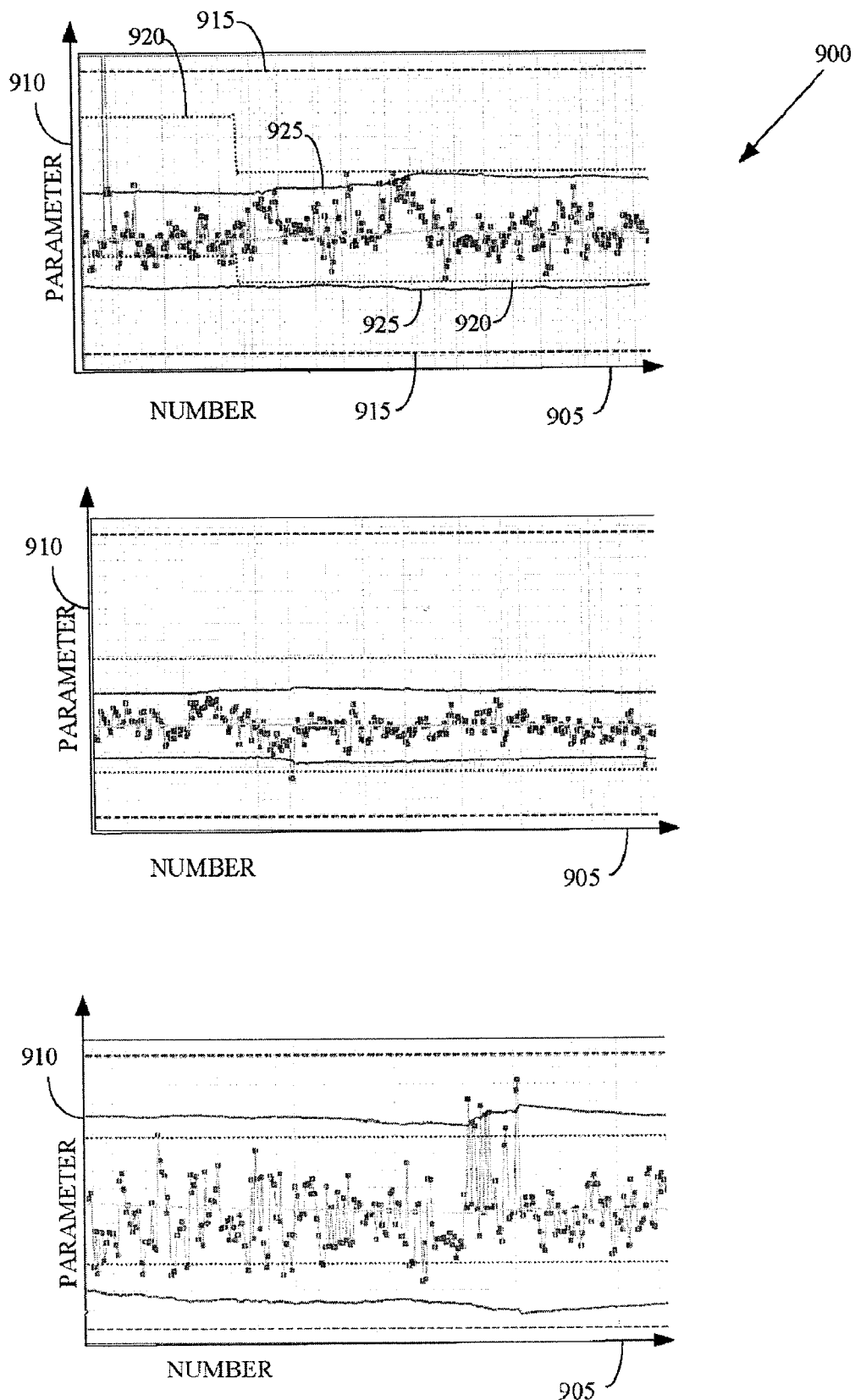
FIG. 9 shows a plot of a single physical parameter measured from a plurality of wafers, in accordance with the present invention.

FIG. 9 shows a plot 900 of a single physical parameter measured from a plurality of wafers. One sample of wafers (or observations) is shown in FIG. 3, but, for ease of illustration, the plot 900 has been divided into three portions. In one embodiment, the plot 900 may be accessed via the one of the entries 450 in the summary report 400 shown in FIG. 4. For example, the entries 450 may allow an engineer to select a detailed view (or raw data view) of a single parameter, which would result in plot 900 being displayed instead of the plot 800 shown in FIG. 8. The horizontal axis 905 indicates a wafer number and the vertical axis 910 indicates value of the physical parameter. Univariate and/or multivariate warning and fault limits associated with the physical parameters and/or composite physical parameters have also been calculated using the recursive principal component analysis model. In the illustrated embodiment, the warning and/or fault limits included upper and lower specification limits 915, upper and lower statistical process control limits 920, and upper and lower dynamic limits 925. In one embodiment, the upper and lower dynamic limits 925 are determined using a model, such as a recursive principal component analysis model.

Figure 10:
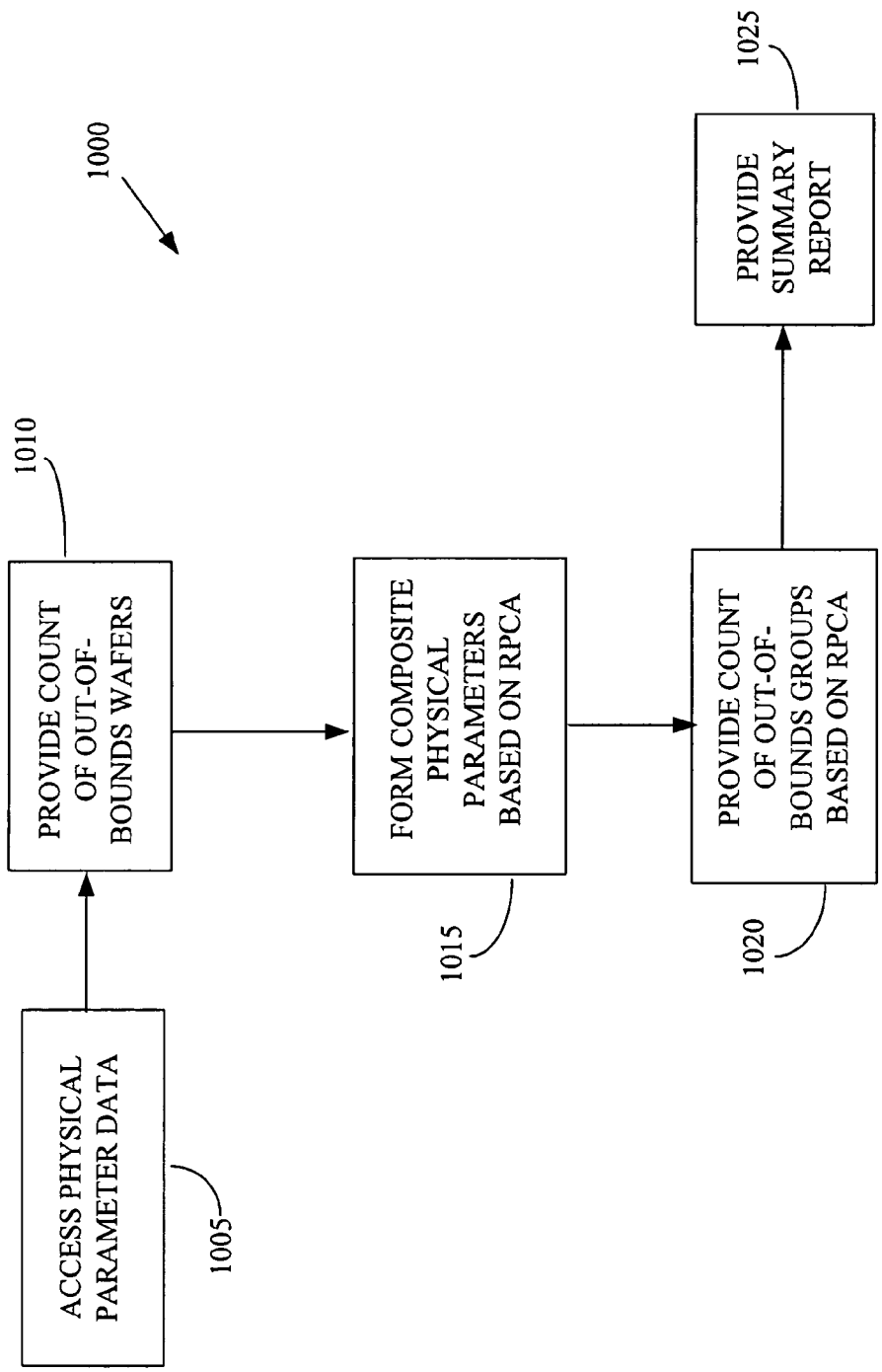
FIG. 10 conceptually illustrates one embodiment of a method of forming a summary report, in accordance with the present invention.

FIG. 10 conceptually illustrates one embodiment of a method 1000 of forming a summary report, such as the summary report 400 shown in FIG. 4. Physical parameter data is accessed (at 1005). For example, the summary report generator 125 shown in FIG. 1 may access (at 1005) physical parameter data associated with one or more wafers 110 from the post-processing test unit 120 and/or the memory 130. A count of a number of out-of-bound wafers may then be provided (at 1010) based on the physical parameter data. For example, as discussed above, various univariate and/or multivariate limits may be determined and used to count the number of wafers having values of physical parameters that are outside of these limits.

One or more composite physical parameters may also be formed (at 1015). In one embodiment, the one or more composite physical parameters are formed (at 1015) based on a model, such as a recursive principal component analysis model. A count of a number of out-of-bound wafers may then be provided (at 1020) based on the one or more composite physical parameters. For example, as discussed above, various univariate and/or multivariate limits may be determined and used to count the number of wafers having values of the composite physical parameters that are outside of these limits. The summary report is then provided (at 1025). For example, the summary report generator 125 may form a summary report 105 and provide the summary report 105 to a computer 130, as discussed above with regard to FIG. 1.

One or more embodiments of the invention described above may be implemented in a semiconductor fabrication facility and may provide a number of advantages over previous techniques for analyzing univariate data. For example, the time required to analyze univariate data that represents hundreds of parameters associated with tens or hundreds of wafers may be reduced. Furthermore, engineers may be provided with relatively quick access to the most relevant information when attempting to diagnose and/or correct faults. Moreover, the warning and/or faults may be classified according to the severity of the faults. For example, if one element and/or device is generating a large number of faults relative to other element and/or devices formed on the wafer, this element and/or device may be highlighted in a summary report, e.g. by listing this element and/or device at the top of the report.

The particular embodiments disclosed above are illustrative only, as the invention may be modified and practiced in different but equivalent manners apparent to those skilled in the art having the benefit of the teachings herein. Furthermore, no limitations are intended to the details of construction or design herein shown, other than as described in the claims below. It is therefore evident that the particular embodiments disclosed above may be altered or modified and all such variations are considered within the scope and spirit of the invention. Accordingly, the protection sought herein is as set forth in the claims below.

What is claimed is:

1. A method, comprising:
   accessing wafer electrical test data indicative of a plurality of electrical parameters associated with a plurality of structures formed on a plurality of processed semiconductor wafers; and
   providing at least one summary report including information indicative of at least one univariate representation of the accessed wafer electrical test data, at least one univariate limit, at least one multivariate representation of the accessed wafer electrical test data, and at least one multivariate limit, the summary report being provided using a graphical user interface.

2. The method of claim 1, wherein providing said at least one summary report comprises providing a plurality of parameter indications, each parameter indication associated with a corresponding physical parameter and including information indicative of a number of the plurality of wafers having values of the corresponding physical parameter outside of at least one univariate limit associated with the corresponding physical parameter.

3. The method of claim 2, further comprising determining the univariate limit, and wherein determining the univariate limit comprises determining at least one of a specification limit, a statistical process control limit, and a dynamic limit.

4. The method of claim 1, wherein providing said at least one summary report comprises forming a plurality of composite physical parameters, each composite physical parameter being based on a model and a group including a portion of the plurality of physical parameters, and each composite physical parameter being associated with one of the semiconductor wafers.

5. The method of claim 4, wherein providing said at least one summary report comprises providing a group indication associated with each group, each group indication including information indicative of a number of the plurality of wafers having values of the composite physical parameters outside of at least one multivariate limit formed based on the model.

6. The method of claim 5, further comprising determining said at least one multivariate limit, and wherein determining said at least one multivariate limit based on the model comprises determining said at least one multivariate limit based on a recursive principal component analysis model.

7. The method of claim 6, wherein determining said at least one multivariate limit based on the model comprises determining at least one of a warning limit and a fault limit.

8. The method of claim 4, wherein forming each composite physical parameter based on each group comprises determining each group based on at least one structure formed on the semiconductor wafer.

9. The method of claim 8, wherein determining each group comprises determining a hierarchical plurality of groups.

10. The method of claim 9, wherein determining the hierarchical plurality of groups comprises determining a hierarchical plurality of groups comprising an overall group and at least one tier group, wherein the overall group includes all of the plurality of physical parameters and wherein each of said at least one tier group comprise a subset of the plurality of physical parameters.

11. The method of claim 4, wherein forming the plurality of composite physical parameters based on the model comprises determining the plurality of composite physical parameters based on a recursive principal component analysis model.

12. The method of claim 1, comprising providing the summary report at predetermined intervals.

13. The method of claim 1, further comprising providing at least one plot, said at least one plot including information indicative of said at least one multivariate limit and the plurality of physical parameters.

14. An apparatus, comprising:
   a graphical user interface;
   a memory for storing wafer electrical test data indicative of a plurality of electrical parameters associated with a plurality of structures formed on a plurality of processed semiconductor wafers; and
   a summary report generator configured to:
   access said wafer electrical test data; and
   provide at least one summary report including information indicative of at least one univariate representation of the accessed wafer electrical test data, at least one univariate limit, at least one multivariate representation of the accessed wafer electrical test data, and at least one multivariate limit, the summary report being provided using the graphical user interface.

15. The apparatus of claim 14, wherein the summary report generator is configured to provide a plurality of parameter indications, each parameter indication associated with a corresponding physical parameter and including information indicative of a number of the plurality of wafers having values of the corresponding physical parameter outside of at least one univariate limit associated with the corresponding physical parameter.

16. The apparatus of claim 15, wherein the summary report generator is configured to determine the univariate limit, and wherein determining the univariate limit comprises determining at least one of a specification limit, a statistical process control limit, and a dynamic limit.

17. The apparatus of claim 14, wherein the summary report generator is configured to form a plurality of composite physical parameters, each composite physical parameter being based on a model and a group including a portion of the plurality of physical parameters, and each composite physical parameter being associated with one of the semiconductor wafers.

18. The apparatus of claim 17, wherein the summary report generator is configured to provide a group indication associated with each group, each group indication including information indicative of a number of the plurality of wafers having values of the composite physical parameters outside of at least one multivariate limit formed based on the model.

19. The apparatus of claim 18, wherein the summary report generator is configured to determine said at least one multivariate limit, and wherein determining said at least one multivariate limit based on the model comprises determining said at least one multivariate limit based on a recursive principal component analysis model.

20. The apparatus of claim 17, wherein the summary report generator is configured to determine a hierarchical plurality of groups.

21. The apparatus of claim 14, wherein the summary report generator is configured to provide the summary report at predetermined intervals.

22. The apparatus of claim 14, wherein the summary report generator is configured to provide at least one plot, said at least one plot including information indicative of said at least one multivariate limit and the plurality of physical parameters.

23. An apparatus, comprising:
   means for accessing wafer electrical test data indicative of a plurality of electrical parameters associated with a plurality of structures formed on a plurality of processed semiconductor wafers;
   means for providing at least one summary report including information indicative of at least one univariate representation of the accessed wafer electrical test data, at least one univariate limit, at least one multivariate representation of the accessed wafer electrical test data, and at least one multivariate limit, the summary report being provided using the graphical user interface.

* * * * *